United States Patent
Manack et al.

(10) Patent No.: US 7,919,842 B2
(45) Date of Patent: Apr. 5, 2011

(54) STRUCTURE AND METHOD FOR SEALING CAVITY OF MICRO-ELECTRO-MECHANICAL DEVICE

(75) Inventors: Christopher D. Manack, Lewisville, TX (US); Steven A. Kummerl, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 196 days.

(21) Appl. No.: 12/405,403

(22) Filed: Mar. 17, 2009

(65) Prior Publication Data

US 2010/0237489 A1     Sep. 23, 2010

(51) Int. Cl.
*H01L 21/60* (2006.01)
*H01L 23/488* (2006.01)

(52) U.S. Cl. ........ 257/678; 257/704; 257/E23.023; 438/125; 438/612

(58) Field of Classification Search ......... 257/692, 257/E23.023, E21.509, 704, 678, 779; 438/121, 438/125, 612
See application file for complete search history.

(56) References Cited

U.S. PATENT DOCUMENTS

| | | | | |
|---|---|---|---|---|
| 6,062,461 | A * | 5/2000 | Sparks et al. | 228/123.1 |
| 6,318,624 | B1 * | 11/2001 | Pattanaik et al. | 228/56.3 |
| 6,400,009 | B1 * | 6/2002 | Bishop et al. | 257/704 |
| 6,852,926 | B2 * | 2/2005 | Ma et al. | 174/539 |
| 7,368,311 | B2 * | 5/2008 | Tilmans et al. | 438/48 |

* cited by examiner

*Primary Examiner* — Roy K Potter
(74) *Attorney, Agent, or Firm* — Yingsheng Tung; Wade J. Brady, III; Frederick J. Telecky, Jr.

(57) ABSTRACT

A cavity package (100) for micrometer-scale MEMS devices surrounding the cavity (210) with the MEMS device (220) with a rim (232) of solder-wettable metal, and then covering the cavity with a roof (240) of solder spanning from rim to rim. A solder body, placed over the cavity to rest on the rim, is reflowed; the surface tension of the liquid solder is reduced by the interfacial tension of the rim metal so that the liquid solder spreads over the rim surface and thereby stretches the liquid ball to a plate-like roof over the cavity. After solidifying the solder, the solder-to-metal seal renders the cavity package hermetic.

21 Claims, 4 Drawing Sheets

STRUCTURE AND METHOD FOR SEALING CAVITY OF MICRO-ELECTRO-MECHANICAL DEVICE

FIELD OF THE INVENTION

The present invention is related in general to the filed of semiconductor devices and processes, and more specifically to the structure and fabrication method of robust, low cost, and mass-producible packages for Micro-Electro-Mechanical devices (MEMS).

DESCRIPTION OF RELATED ART

The wide variety of products collectively called Micro-Electro-Mechanical devices (MEMS) are small devices on the micrometer scale, which may have mechanically moving parts and often movable electrical power supplies and controls, or they may have parts sensitive to thermal, acoustic, or optical energy. Because of the moving and sensitive parts, MEMS have a need for physical and atmospheric protection. Consequently, MEMS are placed on a substrate and have to be surrounded by a housing or package, which has to shield the MEMS against ambient and electrical disturbances, and against stress.

For quasi-hermetic encapsulations, which prevent the ingress of nano-particles, but not of water and oxygen molecules, a MEMS package can be built step-by-step with plastic materials and photolithographic techniques in a batch process flow. For example, packages for bulk acoustic wave (BAW) filters have been manufactured, with micrometer accuracy, using three deposition steps for plastic or metallic layers and two photolithographic definition steps.

Another example of a quasi-hermetic encapsulation is a cavity for a MEMS device covered by a lid of flat metal or of a polymer compound and glued by an adhesive polymer across the cavity or onto straight metal walls surrounding the MEMS device. When a wall is used, the photolithographic technology for the micrometer-scale package couples the wall thickness to the wall height, requiring an aspect ratio of at least 1 to 2.

For fully hermetic encapsulations, which prevent the ingress of water and oxygen molecules in addition to nano-particles, a MEMS package is commonly constructed with ceramic materials, frequently with multi-level metallizations. As an example, the large silicon chips of the digital light processors (DLP™ of Texas Instruments), with the deflectable aluminum micro-mirrors on torsion beams and the circuits for the underlying control electrodes, are assembled on ceramic substrates with multi-level metal interconnections. The assembled micro-mirrors are covered by a glass plate sealed to walls on the substrate, allowing light beams to reach the micro-mirrors.

Other devices in fully hermetic packages, such as MEMS resonators, gyroscopes, and accelerometers, may even require the maintenance of a certain level of vacuum for the life of the product to ensure the performance and stability of the vibrating structure. Packages for some of these resonators and oscillators are built along a semiconductor assembly flow using three or four metal layer deposition steps and two or three photolithographic definition steps. In an exemplary assembly flow to pack MEMS resonators into a cavity with pressures of less than $5 \cdot 10^{-2}$ Torr, a packaging process flow for micrometer accuracy requires 3 material deposition steps and 2 photolithographic definition steps as follows: Depositing a sacrificial layer on top of the MEMS resonators; depositing a cap layer over the sacrificial layer; etching release holes through the cap layer to the sacrificial layer; removing the sacrificial layer through the release holes, thus freeing up the resonators; evacuating the freed-up space around the resonators; depositing a sealant layer over the cap layer to seal the release holes; and opening via holes through the sealant layer to contact the cap layer with metal pads.

SUMMARY OF THE INVENTION

Fully hermetic MEMS packages constructed with ceramic materials are expensive due to their multi-level metallization. Applicants recognized that the market trends towards higher MEMS reliability and lower cost demand fully hermetic packages but without the cost of multi-metal level ceramic materials. Applicants further saw that for micrometer-scale MEMS packages, today's fabrication flows with repeated photolithographic alignment steps are too cost-intensive and time-consuming; the required sets of photomasks are also in conflict with ongoing market trends of rapidly changing customer demands, short manufacturing turn-around time, and pervasive product diversification.

Applicants solved the problem of mass-producing a fully hermetic yet low cost cavity package for micrometer-scale MEMS devices by surrounding the cavity with the MEMS device with a rim of solder-wettable metal and then covering the cavity with a roof of solder spanning from rim to rim. As Applicants discovered, when a solder body, placed over the cavity to rest on the rim, is reflowed, the surface tension of the liquid solder is reduced by the interfacial tension of the rim metal so that the liquid solder spreads over the rim surface and thereby stretches the liquid ball to a plate-like roof over the cavity. After solidifying the solder, the solder-to-metal seal renders the cavity package hermetic.

A suitable metal of the rim includes a base metal of copper topped by a layer of nickel and an outermost layer of a noble metal such as palladium or gold. A suitable solder includes a tin alloy including, for instance, tin, silver and copper. A preferred device example is a semiconductor chip, with electronic circuitry on one of its surfaces, serving as the carrier. A cavity is etched into the chip surface with the circuitry and a MEMS device placed in the cavity. After patterning a copper ring around the cavity perimeter, the layers of nickel and noble metal are deposited (plated) on the copper. A body of tin-based solder, preferably shaped as a spherical ball, is placed over the cavity so that the body rests on the edge of the ring. Raising the temperature to the solder reflow range, the liquefied solder is pulled by interfacial tension across the ring surface, wetting the nickel-plated copper ring, and changing its spherical to a plate-like shape. Back at ambient temperature, the solder spans across the cavity like a roof, hermetically sealing the cavity with the MEMS device.

It is a technical advantage that no additional assembly steps are needed to attach a lid for sealing the cavity. Since attaching a lid is typically an expensive process, the sealing method of the invention offers very low cost.

It is another technical advantage that the sealing method of the invention is largely independent of the cavity size, rendering the MEMS package versatile. In particular, the method lends itself to device scaling.

It is yet another technical advantage that the sealing method of the invention lends itself to mass production of fully hermetic packages; the method can be applied to complete semiconductor wafers.

BRIEF DESCRIPTION OF THE DRAWINGS

FIG. 3 shows a schematic top view of an overcoat-covered exemplary carrier with metal pads and the opening of a cavity into the carrier surface; the perimeter of the cavity opening is surrounded by a metallic rim.

FIG. 4 is a schematic cross section of the exemplary carrier in FIG. 3 along the line indicated in FIG. 3.

FIG. 5 illustrates the schematic cross section of the carrier in FIG. 4 after the steps of placing a MEMS device into the cavity and placing solder bodies on the metal pads; the solder body over the cavity opening contacts the edge of the metallic rim around the cavity opening.

DETAILED DESCRIPTION OF THE PREFERRED EMBODIMENTS

Figure 1:
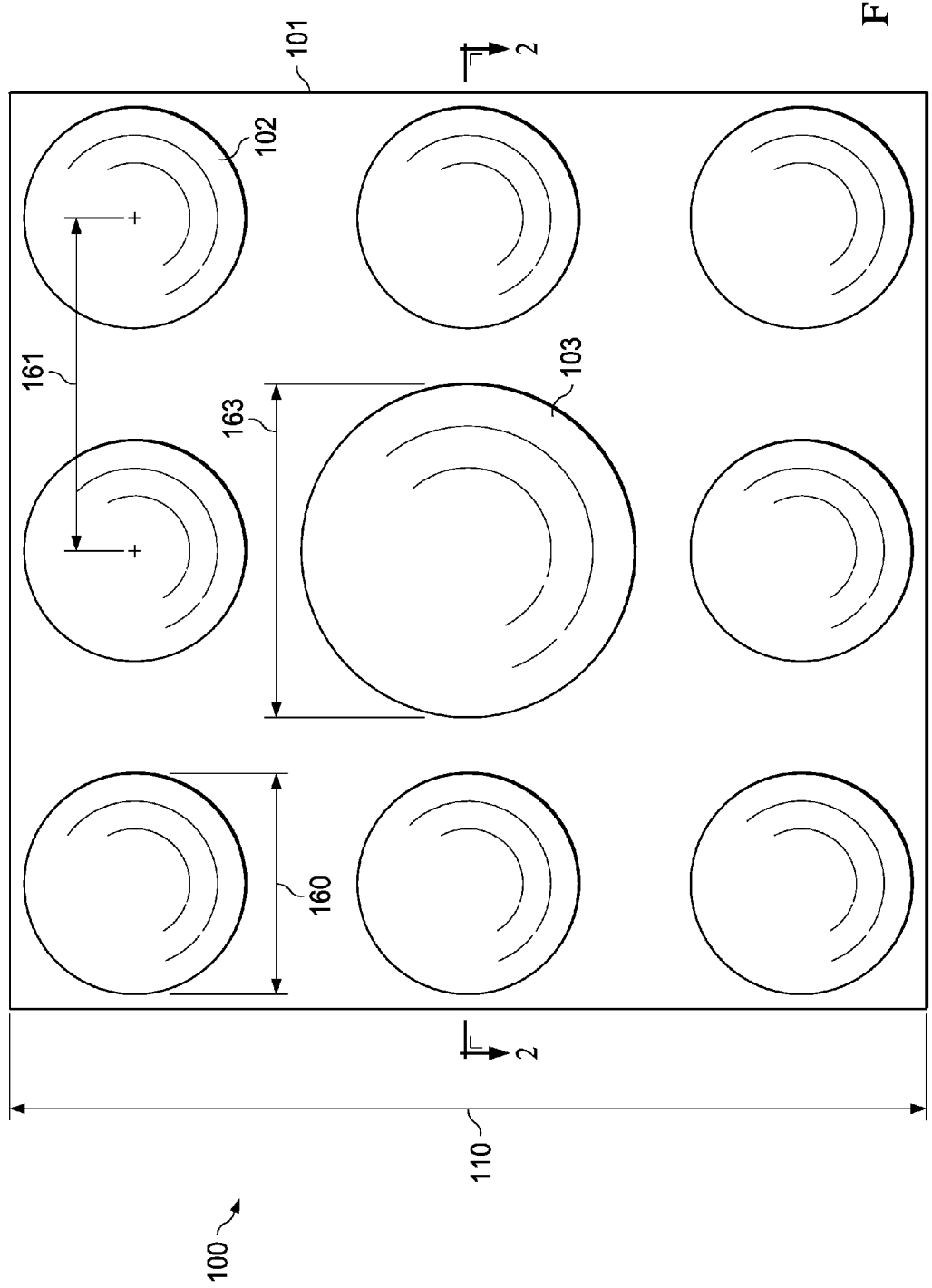
FIG. 1 is a schematic top view of an exemplary semiconductor chip-size cavity device 100, which encapsulates a micro-electro-mechanical device in a cavity.

FIG. 1 is a schematic top view of an exemplary semiconductor chip-size device 100, which includes a micro-electromechanical device (MEMS). As depicted in FIG. 1, the surface of device 100 has an insulating overcoat 101; further on the surface are a plurality of solder bodies 102 and a center larger solder body 103. The overcoat may be a layer of silicon dioxide or silicon nitride, or it may be a layer of polyimide. The solder bodies may include an alloy of metals such as tin, silver, copper or other alloyed elements. As an example of the device dimensions, the diameter 160 of the solder bodies 102 may be between 0.25 to 0.35 mm, and the pitch center-to-center 161 of the solder bodies 102 may be about 0.5 mm. The diameter 163 of the center solder body 103 may be between about 0.5 and 0.6 mm; it may have a larger diameter. The side length 110 of the square-shaped device 100 may be about 1.5 mm. The line marked "FIG. 2" indicates the location of the cross section of device 100 illustrated in FIG. 2.

Figure 2:
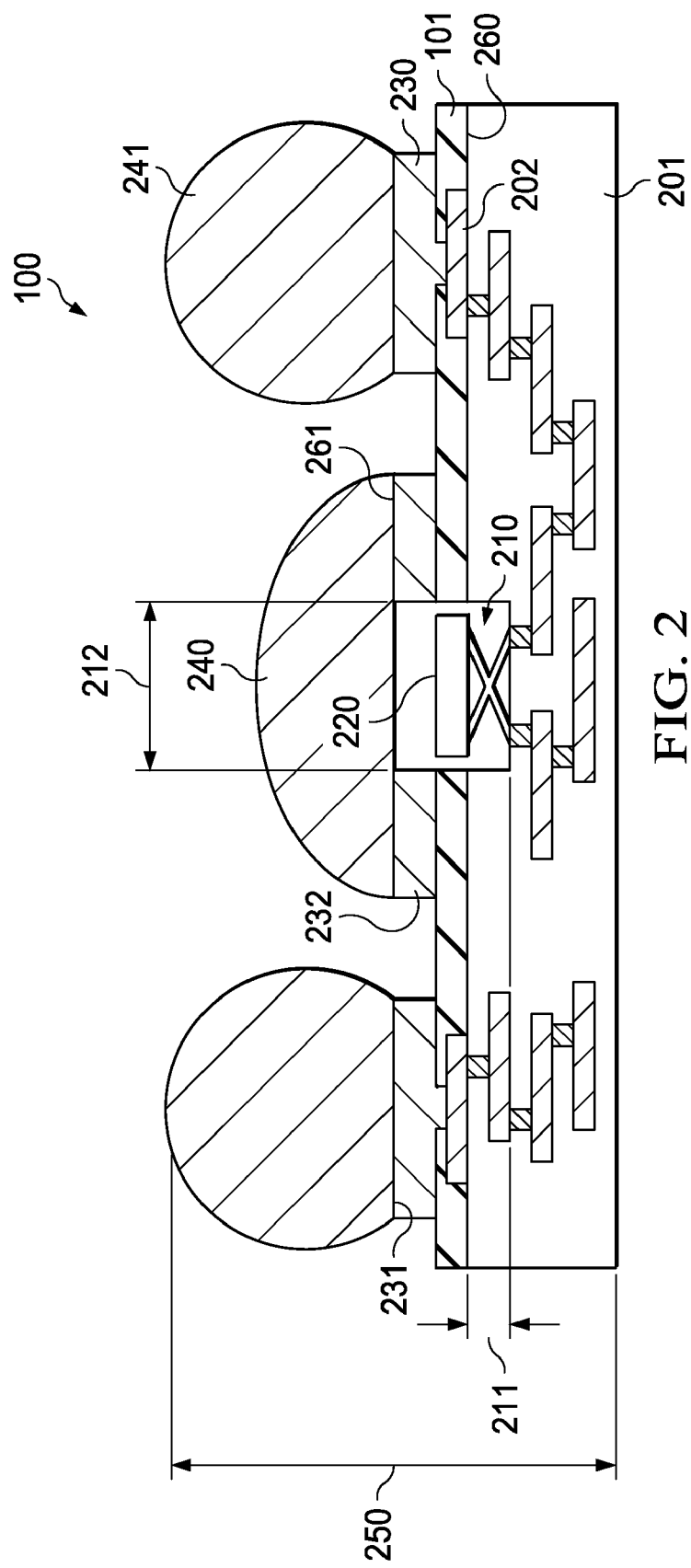
FIG. 2 illustrates a schematic cross section of the device in FIG. 1 along the line indicated in FIG. 1. A metal rim surrounds the opening of a cavity with the MEMS device, and a roof of solder spans across the opening. The solder enclosure is the result of a reflow process, wherein the surface tension of a liquid solder body is reduced by the interfacial tension of the rim metal so that the liquid body is pulled over the rim surface and the body is stretched to a plate-like roof.

The cross section of device 100 in FIG. 2 shows a carrier 201, which may be made of a semiconductor material such as silicon; alternatively, carrier 201 may be made of an insulating material. The carrier includes conductive lines and vias, shown only schematically in FIG. 2. In some carriers, the lines are patterned from a hierarchy of several metal layers, which are interconnected by conductive vias. The preferred metal for the layers is copper; alternatively, they may be made of aluminum, an alloy, or carbon. When the carrier is made of a semiconductor material, it preferably includes electronic circuitry on one of its surfaces (not shown in FIG. 2). Carrier 201 has the surface 260 (which may include the circuitry) covered by an insulating protective overcoat 101, preferably made of a film of silicon nitride or silicon dioxide, or films of both materials; alternatively, overcoat 101 may be a polymer layer, for instance of a polyimide compound. Overcoat 101 has a plurality of windows, which allow access to the metal layers of the carrier. The metal portions exposed in the windows are designated 202. Contacting the exposed metal portions 202 are metal layers or metal studs 230, which are preferably made of copper and are metallurgically prepared to be solderable (solder wettable). A preferred method of preparation for solder wettability consists of depositing a layer of nickel (not shown in FIG. 2) in contact with the stud metal (for instance, copper) surface 231 and then depositing a layer of a noble metal such as palladium or gold, or both (not shown in FIG. 2), in contact with the nickel.

Included in the carrier surface 260 is a cavity 210, which extends into the material of carrier 201. Cavity 210 has a depth 211 and a width 212 sufficient to place a micro-electromechanical (MEMS) device 220 in the cavity and connect the MEMS device to the conductive lines embedded in carrier 201. As an example, a cavity width, or diameter, between 180 and 220 μm and depth of 50 to 100 μm can accommodate many MEMS devices. Examples of suitable MEMS devices include infrared sensors (when the carrier is made of silicon which is transparent to infrared radiation), digital micro-mirror devices, accelerometers, gyroscopes, and pressure sensors. Dependent on the device to be placed in the cavity, the opening of cavity 210 may be shaped in a variety of ways. For the MEMS device shown in FIG. 2, the opening preferably extends through the overcoat layer 101 with the same width 212 as the cavity itself. For other devices, overcoat layer 101 may project like a ledge into the opening, effectively narrowing the entrance to the cavity. For yet other devices, the overcoat layer still stretches across the opening but exhibits a plurality of small holes through the layer, forming a sieve-like opening. The shape of the opening is strongly determined by the method used to create the opening (see below).

Surrounding the cavity opening is a metal rim 232, which completely encircles the one or several cavity openings. The rim is made of a base metal, preferably copper, and is metallurgically prepared to be solderable (solder wettable). A preferred method of preparation for solder wettability consists of depositing a layer of nickel in contact with the stud metal (for instance, copper) surface 261 and then depositing a layer of a noble metal such as palladium or gold, or both, in contact with the nickel (the nickel and noble metal layers are not shown in FIG. 2). An alternative method includes the application of a solder flux.

In the preferred fabrication method, studs 230 and rim 232 are patterned from the same layer of metal. In this case, studs 230 and 232 have the same thickness. For the carrier depicted in FIG. 2, a preferred thickness is about 0.05 mm. Alternatively, pads 230 may be thicker than rim 232; in this case, pads 230 resemble metal studs. The metallurgical preparation for solder wettability of studs 230 and rim 232 is preferably performed after the patterning step. Alternatively, the layers of nickel and noble metal are deposited first, and then the patterning step is executed thereafter.

As FIG. 2 illustrates, a roof-like plate 240 of solder spans across the cavity opening. The solder of roof 240 is attached to the metal of rim 232 completely around the cavity opening. Due to the method of fabrication (see below), the roof may have a slightly convex outline. It is preferred that the solder outline facing the cavity is approximately flat or slightly concave. In addition in FIG. 2, solder bodies 241 are attached to the studs 230. Solder bodies 241 have a substantially spheroidal shape. The attachment of solder 240 to the metal rim 232, and of the solder bodies 241 to the metal studs 230 is preferably achieved by a reflow process step at the same melting temperature (see below). Alternatively, solders of different melting temperatures may be used. It is further preferred that the volume of the solder roof 240 is about the same as the volume of the solder bodies 241; this feature can be accomplished by using solder spheres of the same diameter for all attachment sites (see below). As a consequence, the taller height of solder bodies 241 allows the spheroidal bodies to stand higher over the carrier surface than the apex of the roof-like body 240. Consequently, solder bodies 241 facilitate the attachment of device 100 to external parts.

As an example of the device dimensions, the height of the attached solder bodies 241 may be in the range from about 0.15 to 0.35 mm; the overall thickness 250 of device 100 may be between about 0.6 and 0.7 mm. A MEMS device in a package of small thickness and footprint is suitable for space-constrained consumer products such as cell phones and laptops.

Figure 3:
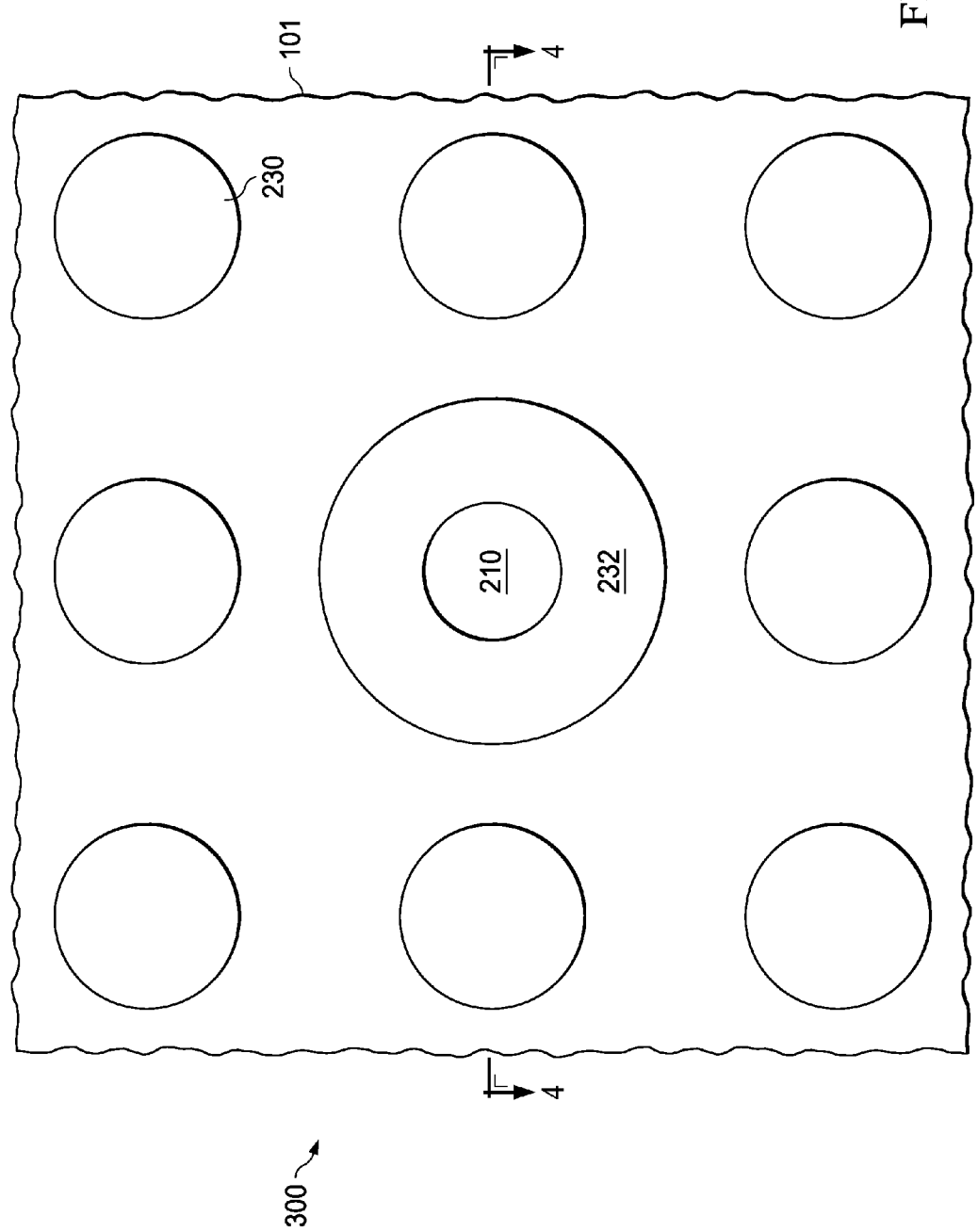
FIGS. 3 to 5 depicts certain process steps in fabricating the MEMS package according to the invention.
Figure 4:
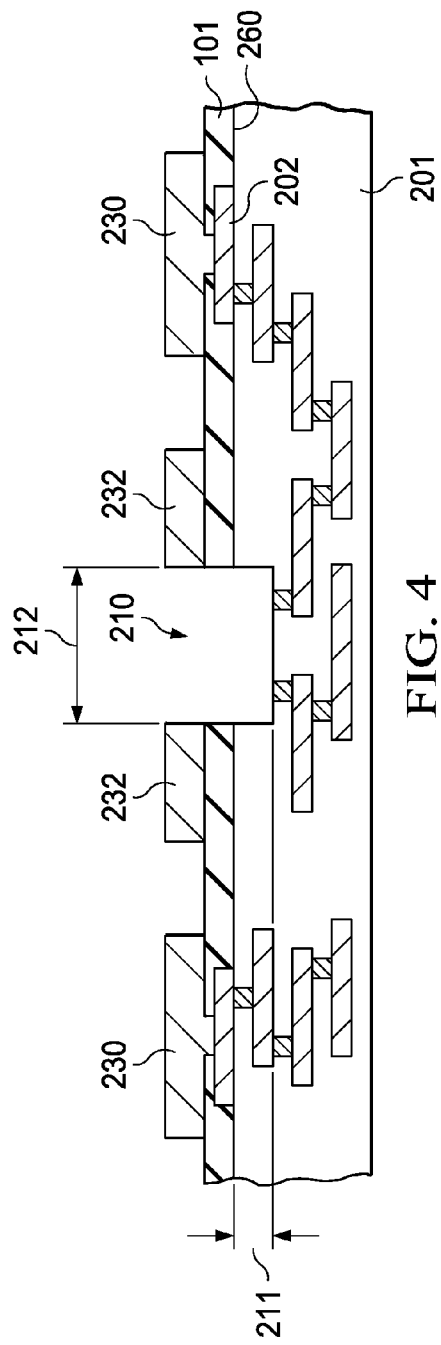
Figure 5:
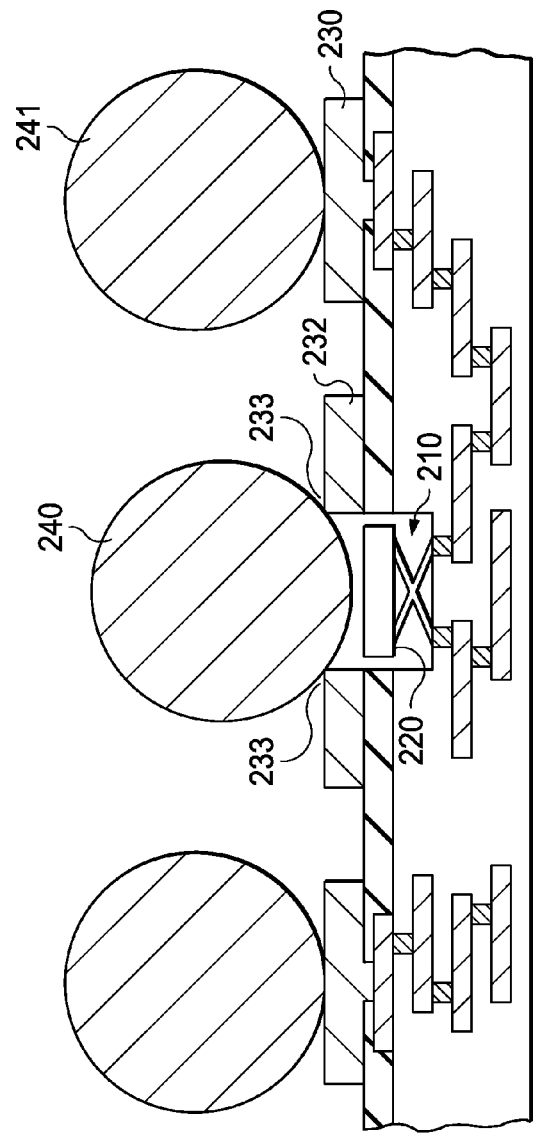

Another embodiment of the invention is a method for fabricating the package of a MEMS device. Several process steps of the method are depicted in FIGS. 3 to 5. Equal parts are designated by equal numbers, in agreement with FIGS. 1 and 2. FIG. 3 illustrates the top view of an exemplary carrier, generally designated 300, which is intended to serve as a portion of the package for a MEMS device. Carrier 300 may be a semiconductor chip with an integrated circuit, or it may be an insulating substrate integral with conducting line and vias. In the preferred process, carrier 300 is a portion of a whole semiconductor wafer; for this reason, FIG. 3 depicts the outline of carrier 300 in indefinite contours.

In FIG. 3, carrier 300 is viewed from top; the line across the center indicates the cross section through carrier 300 for the depiction of the cross sectional view in FIG. 4. The surface of carrier 300 has an insulating overcoat 101, preferably made of a layer of silicon dioxide or silicon nitride, or both, or of a layer of polyimide. Further on the surface is a plurality of metal pads 230, which are the terminals for the MEMS device and for any circuitry and interconnections embedded in carrier 300. In addition, included in the surface of carrier 300 is the opening of a cavity 210 into the carrier. Cavity 210 may have only a single opening, as depicted in the example of FIG. 4, or it may have a plurality of openings, which are in some devices arranged as an array. The circular outline of the cavity opening in FIG. 3 is to be understood exemplary; in other devices, the perimeter may have a rectangular-shaped, or a round-elongated, or any irregular outline.

Surrounding the opening of cavity 210 is a metallic rim 232, which is preferably made of copper or a copper alloy. Rim 232 is preferably positioned on overcoat 101, because this arrangement allows the patterning of the rim in the same process step as the patterning of all metal pads 230 from a single metal layer deposited on the overcoat surface; in addition, the surface preparation of rim and pads for solder wettability can be performed concurrently.

The cross section of exemplary carrier 300, taken at the line indicated in FIG. 3, is shown in FIG. 4. The carrier 201 may be made of a semiconductor material such as silicon or of an insulating material. It may include conductive lines and vias. When the carrier is made of a semiconductor material, it preferably includes electronic circuitry on one of its surfaces (not shown in FIG. 4). As stated above, overcoat 101 on the carrier surface may be a film of silicon nitride or silicon dioxide, or films of both materials; alternatively, overcoat 101 may be a polymer layer, for instance of a polyimide compound. Overcoat 101 has a plurality of windows, which allow access to the metal layers of the carrier. The metal portions exposed in the windows are designated 202. Contacting the exposed metal portions 202 are metal pads, or studs, 230, which preferably are patterned from the base metal copper. They are metallurgically prepared to be solderable (solder wettable). As stated earlier, a preferred method of preparation for solder wettability consists of depositing a layer of nickel in contact with the base metal (for instance, copper) and then depositing a layer of a noble metal such as palladium or gold, or both, in contact with the nickel.

Included in the carrier surface 260 is a cavity 210. In the example of FIG. 4, cavity 210 extends through the overcoat layer 101 into the material of carrier 201. For MEMS devices such as infrared sensors, it is advantageous to form the cavity into the same carrier surface, which includes the circuitry of the device; in this fashion the opposite carrier surface remains available for undisturbed radiation transmission to the MEMS device in the cavity. When the material of the carrier is a semiconductor like silicon, the preferred method of forming cavity 210 includes the following steps:

Opening one or more holes through the overcoat to reach the semiconductor.

Using an isotropical etch technique through each hole, dry etching indentations into the semiconductor until the indentations coalesce and a unified cavity is formed.

Cavity 210 has a depth 211 and a width 212 sufficient to place a micro-electro-mechanical (MEMS) device 220 in the cavity. Examples of suitable MEMS devices include infrared sensors (when the carrier is made of silicon which is transparent to infrared radiation), digital micro-mirror devices, accelerometers, gyroscopes, and pressure sensors.

In the next process step, the surface of the overcoat is sputtered for improved adhesion. Then, in the preferred fabrication method, the steps for forming the metal rim 232 surrounding the cavity opening, and the metal contact pads 230 are performed simultaneously. The process steps include the following:

Sputtering seed metal on the overcoat.

Plating a layer of copper on the overcoat.

Plating a layer of nickel on the copper.

Plating a layer of noble metal (for example, palladium or gold) on the nickel.

Patterning the metal layers to form the pads 230 and the cavity rim 232.

In an alternative fabrication method, the step of patterning is performed after the step of plating the copper layer and before the step of plating the nickel layer. In this modification, the solderable layers are plated over all exposed surfaces including the sidewalls of the etched metal. In both fabrication methods, rim 232 and pads 230 have the same metal thickness.

A mentioned earlier, some products prefer a thicker metal thickness for pads 230 compared to rim 232. Pads 230 are frequently referred to as studs. The plating methods of solderable metal layers described above are also applicable for these differentiated stud and rim thicknesses.

In the next process steps, depicted in FIG. 5, MEMS device 220 is placed in the cavity. Thereafter, in the preferred process flow, solder bodies 241 and 240, preferably prefabricated spherical solder balls of approximately identical diameter, are placed on the metal surfaces after some flux has been sprayed on pads 230 to enhance the adhesion of the solder to the plated metal surfaces and prevent the bodies from rolling off the pads. Solder balls positioned on pads 230 are designated 241. The preferred solder is a tin alloy including silver and copper.

In the same process step, the approximately spherical solder ball 240 for rim 232 surrounding the cavity 220 is dropped concentrically in the center of the ring-shaped rim opening. The ball is lowered to some extent into the opening of cavity 210 and comes to rest by touching the edges 233 of the rim, which face the cavity. The width and depth of the cavity and the diameter of solder body 240 had been selected so that solder body 240 does not touch MEMS device 220.

Next, the temperature is raised to just above the melting, or reflow, temperature of the solder. For example, for a tin-solver-copper alloy with a melting temperature of 217° C., the temperature is raised to about 220 to 225° C. The top surface layer of the noble metal (for instance, palladium) dissolves into the molten solder, allowing direct contact of the solder to the fresh nickel surface. The surface tension of the liquid solder is reduced by the interfacial tension of the nickel. Consequently, the liquefied solder bodies 241 spread over the surface of pads 230, resulting in a flattened spheroidal shape similar to the one shown in FIG. 2.

At the same time, the surface tension of the liquefied solder 240 is reduced by the interfacial tension of the nickel on rim 232. The liquefied solder ball 240 spreads over the surface of rim 232 and thereby stretches the spheroidal ball to the plate-like cover 240 illustrated in FIG. 2. The solder in the plate-like configuration spans like a roof over the cavity. The outer cover surface is convex and the inner surface approximately flat or slightly concave. In this process, the complete wetting of solder 240 and rim 232 seals the enclosed cavity 210 fully hermetic.

The solder is solidified by lowering the temperature to ambient temperature. The cover retains its plate-like configuration, the cavity 210 remains hermetically sealed, and the MEMS device 220 fully protected.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any material for the carrier of a MEMS package; when the carrier material is a semiconductor, it may include silicon, silicon germanium, gallium arsenide, or any other semiconductor or compound material used in integrated circuit manufacturing. Further, the semiconductor carrier may include an integrated circuit, a discrete device, or passive components.

As another example, the encapsulation method can be extended to package any semiconductor device on a substrate so that it is fully hermetic, or quasi-hermetic, without immersion in a pervasive material such as a polymeric molding compound. The foil bulge with its cross sections parallel to the substrate monotonically decreasing from the bulge rim to the bulge apex provides hermetic housing on a low cost, quick turn-around, and customer-oriented level.

As another example, the carrier is metallic and has a plurality of via holes, with a connector in each via, to the devices assembled on the carrier (the connectors, of course, are insulated from the metallic carrier), and the device is encapsulated by the dome-shaped metal foil. In this fashion, the device is electrostatically shielded against radiation in a package simulating a Faraday cage/screen.

As another example, the method can be extended beyond the fabrication of semiconductor packages to the encapsulation of any devices on a substrate, of a micrometer scale as well as orders of magnitude larger, where hermeticity, partial or full, is essential and the bulging foil over the device has cross sections parallel to the substrate monotonically decreasing from the bilge rim to the bulge apex.

It is therefore intended that the appended claims encompass any such modifications or embodiments.

We claim:

1. An apparatus comprising:
a carrier having a surface, the carrier including a cavity with an opening to the surface;
a metal rim on the surface, the rim surrounding the opening, the metal being wettable by solder; and
solder attached to the metal rim, the solder spanning across the cavity opening.

2. The apparatus of claim 1 wherein the solder spanning the opening has a plate-like shape.

3. The apparatus of claim 2 wherein the solder includes tin.

4. The apparatus of claim 1 wherein the rim includes a base metal and a metallurgical surface configuration suitable for solder wetting.

5. The apparatus of claim 4 wherein the base metal includes copper.

6. The apparatus of claim 5 wherein the metallurgical surface includes a layer of nickel in contact with the copper and an outermost layer of a noble metal in contact with the nickel, wherein the noble metal is selected from a group including gold, palladium, and palladium-nickel alloys.

7. The apparatus of claim 1 wherein the carrier is a semiconductor chip having a surface including an electronic circuitry.

8. The apparatus of claim 7 wherein the cavity extends into that surface of the chip, which includes the circuitry.

9. The apparatus of claim 8 further including a device inside the cavity.

10. The apparatus of claim 9 wherein the device is a micro-electro-mechanical (MEMS) device.

11. The apparatus of claim 8 further including, on the carrier surface with the cavity, metal pads for attaching solder bodies.

12. A method for fabricating a package for a device, comprising the steps of:
reflowing a solder body resting on the solderable metal rim surrounding a cavity opening in the surface of a carrier so that the solder spans across the cavity opening.

13. The method of claim 12 further including, before the step of reflowing, the steps of:
forming a cavity into the surface of a carrier so that the cavity has an opening at the surface;
patterning a metal rim surrounding the opening from a layer of base metal;
preparing the surface of the rim metal to render it wettable by solder; and
placing a solder body over the cavity to rest on the rim.

14. The method of claim 13 wherein the step of preparing includes the steps of:
depositing a layer of nickel on the rim base metal; and
depositing a layer of a noble metal on the nickel.

15. The method of claim 14 wherein the noble metal is selected from a group including gold, palladium, and palladium-nickel alloys.

16. The method of claim 13 further including, after the step of preparing, the step of placing a device inside the cavity.

17. The method of claim 16 wherein the device is a micro-electro-mechanical (MEMS) device.

18. The method of claim 13 wherein the base metal includes copper.

19. The method of claim 12 wherein the solder includes tin.

20. The method of claim 12 wherein the carrier is a semiconductor chip having a surface including an electronic circuitry.

21. The method of claim 20 wherein the cavity extends into that surface of the chip, which includes the circuitry.

* * * * *